US006955718B2

(12) United States Patent
Falster et al.

(10) Patent No.: US 6,955,718 B2
(45) Date of Patent: Oct. 18, 2005

(54) PROCESS FOR PREPARING A STABILIZED IDEAL OXYGEN PRECIPITATING SILICON WAFER

(75) Inventors: Robert J. Falster, London (GB); Vladimir V. Voronkov, Merano (IT)

(73) Assignee: MEMC Electronic Materials, Inc., St. Peters, MO (US)

(*) Notice: Subject to any disclaimer, the term of this patent is extended or adjusted under 35 U.S.C. 154(b) by 90 days.

(21) Appl. No.: 10/615,127

(22) Filed: Jul. 8, 2003

(65) Prior Publication Data

US 2005/0005841 A1 Jan. 13, 2005

(51) Int. Cl.[7] .............................................. C30B 15/20
(52) U.S. Cl. .......................................... 117/20; 117/19
(58) Field of Search .................................... 117/19, 20

(56) References Cited

U.S. PATENT DOCUMENTS

| | | | |
|---|---|---|---|
| 4,314,595 A | 2/1982 | Yamamoto et al. | |
| 4,376,657 A | 3/1983 | Nagasawa et al. | |
| 4,437,922 A | 3/1984 | Bischoff et al. | |
| 4,851,358 A | 7/1989 | Huber | |
| 4,868,133 A | 9/1989 | Huber | |
| 5,327,007 A | 7/1994 | Imura et al. | |
| 5,401,669 A | 3/1995 | Falster et al. | |
| 5,403,406 A | 4/1995 | Falster et al. | |
| 5,445,975 A | 8/1995 | Gardner et al. | |
| 5,502,010 A | 3/1996 | Nadahara et al. | |
| 5,502,331 A | 3/1996 | Inoue et al. | |
| 5,534,294 A | 7/1996 | Kubota et al. | |
| 5,561,316 A | 10/1996 | Fellner | |
| 5,593,494 A | 1/1997 | Falster | |
| 5,611,855 A | 3/1997 | Wijaranakula | |
| 5,674,756 A | 10/1997 | Satoh et al. | |
| 5,738,942 A | 4/1998 | Kubota et al. | |
| 5,788,763 A | 8/1998 | Hayashi et al. | |
| 5,885,905 A | 3/1999 | Nadahara et al. | |
| 5,939,770 A | 8/1999 | Kageyama | |
| 5,944,889 A | 8/1999 | Park et al. | |
| 6,191,010 B1 | 2/2001 | Falster | |
| 6,204,152 B1 | 3/2001 | Falster et al. | |
| 6,306,733 B1 | 10/2001 | Falster et al. | |
| 6,361,619 B1 * | 3/2002 | Falster et al. | 148/33.2 |
| 6,632,277 B2 * | 10/2003 | Dietze et al. | 117/2 |
| 6,686,260 B2 * | 2/2004 | Falster et al. | 438/473 |
| 6,808,781 B2 * | 10/2004 | Mule'Stagno et al. | 428/64.1 |

FOREIGN PATENT DOCUMENTS

| | | |
|---|---|---|
| DE | 43 23 964 A1 | 1/1994 |
| EP | 0 503 816 A1 | 9/1992 |
| EP | 0 536 958 A1 | 4/1993 |
| EP | 0 954 018 A1 | 11/1999 |
| EP | 0 964 435 A1 | 12/1999 |

(Continued)

OTHER PUBLICATIONS

Falster, R., et al, The Engineering of Silicon Wafer Material Properties Through Vacancy Concentration Profile Control and the Achievement of Ideal Oxygen Precipitation Behavior, Mat. Res. Soc. Symp. Proc., vol. 510, 1998, p. 27-35.

(Continued)

*Primary Examiner*—Felisa Hiteshew
(74) *Attorney, Agent, or Firm*—Senniger Powers

(57) ABSTRACT

The present invention is directed to a single crystal Czochralski-type silicon wafer, and a process for the preparation thereof, which has a non-uniform distribution of stabilized oxygen precipitate nucleation centers therein. Specifically, the peak concentration is located in the wafer bulk and a precipitate-free zone extends inward from a surface.

22 Claims, 4 Drawing Sheets

FOREIGN PATENT DOCUMENTS

| | | | |
|---|---|---|---|
| EP | 1 146 150 A2 | 10/2001 | |
| JP | 5155700 | 6/1993 | |
| JP | 7201874 | 8/1995 | |
| JP | 7321120 | 12/1995 | |
| JP | 7335657 | 12/1995 | |
| JP | 8045944 | 2/1996 | |
| JP | 8045945 | 2/1996 | |
| JP | 9199416 | 7/1997 | |
| JP | 11067781 | 3/1999 | |
| JP | 11150199 | 6/1999 | |
| JP | 2002 134516 | 5/2002 | |
| WO | WO 98/38675 | 9/1998 | |
| WO | WO 98/45507 | 10/1998 | |

OTHER PUBLICATIONS

Hara, A., et al, Enhancement of Oxygen Precipitation in Quenched Czochralski Silicon Crystals, Journal of Applied Phys., vol. 66, 1989, p. 3958-3960.

Hawkins, G.A., et al, Effect of Rapid Thermal Processing on Oxygen Precipitation in Silicon, Mat. REs. Soc. Symp. Proc., vol. 104, 1988, p. 197-200.

Hawkins, G.A., et al, The Effect of Rapid Thermal Annealing on the Precipitation of Exygen in Silicon, J. Appl. Phys., vol. 65, No. 9, 1989, p. 3644-3654.

Jacob, M., et al, Influence of TRP on Vacancy Concentrations, Mat. REs. Soc. Symp. Proc., vol. 490, 1998, p. 129-134.

Nadahara, S., et al, Hydrogen Annealed Silicon Wafer, Solid State Phenomena, vols. 57-58, 1997, p. 19-26.

Pagani, M., et al, Spatial Variations in Oxygen Precipitation in Silicon After High Temperature Rapid Thermal Annealing, Appl. Phys. Lett., vol. 70, No. 12, 1997, p. 1572-1574.

Shimizu, H., et al, Effects of Surface Defects (COPs) On Isolation Leakage and Gate Oxide Integrity in MOS Large-Scale-Integrated-Circuit Devices and Cost Effective p-IpEpitaxial Wafers, Electrochemical Society Proceedings, vol. 99, No. 1, p. 315-323 (from a presentation on or about May 3, 1999).

Shimizu, H., et al., Excellence of Gate Oxide Integrity in Metal-Oxide-Semiconductor Large-Scale-Integrated Circuits Based on P-/P-Thin-Film Epitaxial Silicon Wafers, Jpn. J. Appl. Phys., vol. 36, Part 1, No. 5A, 1997, p. 2565-2570.

Shimura, F., Semiconductor Silicon Crystal Technology, Academic Press, Inc., San Diego, CA, 1989, p. 361-377.

PCT International Search Report for PCT/US2004/020522 dated Dec. 14, 2004, 3 pages.

* cited by examiner

PROCESS FOR PREPARING A STABILIZED IDEAL OXYGEN PRECIPITATING SILICON WAFER

BACKGROUND OF THE INVENTION

The present invention generally relates to the preparation of semiconductor material substrates, especially silicon wafers, which are used in the manufacture of electronic components. More particularly, the present invention is directed to a process for treating a silicon wafer to form an ideal, non-uniform depth distribution of stabilized oxygen precipitates, i.e., the size of the oxygen precipitates is sufficient to withstand being rapidly heated to temperatures not in excess of 1150° C.

Single crystal silicon, which is the starting material for most processes for the fabrication of semiconductor electronic components, is commonly prepared with the so-called Czochralski process wherein a single seed crystal is immersed into molten silicon and then grown by slow extraction. As molten silicon is contained in a quartz crucible, it is contaminated with various impurities, among which is mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. As the crystal grows from the molten mass and cools, therefore, the solubility of oxygen in it decreases rapidly, whereby in the resulting slices or wafers, oxygen is present in supersaturated concentrations.

Thermal treatment cycles which are typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes included a series of steps which were designed to produce silicon having a zone or region near the surface of the wafer which is free of oxygen precipitates (commonly referred to as a "denuded zone" or a "precipitate free zone") with the balance of the wafer, i.e., the wafer bulk, containing a sufficient number of oxygen precipitates for IG purposes. Denuded zones can be formed, for example, in a high-low-high thermal sequence in which (a) oxygen is out-diffused at a high temperature (>1100° C.) in an inert ambient for a period of at least about 4 hours, (b) oxygen precipitate nuclei are formed at a low temperature (600–750° C.), and (c) oxygen precipitates ($SiO_2$) are grown at a high temperature (1000–1150° C.). See, e.g., F. Shimura, *Semiconductor Silicon Crystal Technology*, Academic Press, Inc., San Diego, Calif. (1989) at pages 361–367 and the references cited therein.

More recently, however, advanced electronic device manufacturing processes such as DRAM manufacturing processes have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, all IG potential is lost.

SUMMARY OF THE INVENTION

Among the objects of the invention, therefore, is the provision of a process to produce a single crystal silicon wafer which has an ideal, non-uniform depth distribution of stabilized oxygen precipitate nucleation centers which can withstand being rapidly heated to temperatures not in excess of 1150° C.; a process for producing a wafer having an ideal, non-uniform depth distribution of stabilized oxygen precipitate nucleation centers without subjecting the wafer to separate thermal treatment to nucleate and grow oxygen precipitate nucleation centers; a process for tailoring the depth of a precipitate-free region in such a wafer; a process for controlling the concentration profile stabilized oxygen precipitate nucleation centers in such a wafer.

Briefly therefore, the present invention is directed to a process for the preparation of a single crystal silicon wafer having a controlled oxygen precipitation behavior. The process comprises selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, and a bulk layer which comprises the region of the wafer between the central plane and the front surface layer. The selected wafer is heated to an annealing temperature $T_A$ to form crystal lattice vacancies in the front surface and bulk layers of the wafer. The heated wafer is cooled from $T_A$ to an upper nucleation temperature $T_U$ at a rate R to form a vacancy concentration profile in the wafer wherein the peak density of vacancies is in the bulk layer with the concentration generally decreasing from the location of the peak density in the direction of the front surface of the wafer. The vacancy profiled wafer is maintained within a nucleation temperature range that is bounded by $T_U$ and a lower nucleation temperature $T_L$ for a nucleation duration $t_n$ to form oxygen precipitate nucleation centers in the bulk layer that are incapable of being dissolved at temperatures below about 1150° C. and a region free of oxygen precipitate nucleation centers in the surface layer. The concentration of oxygen precipitate nucleation centers in the bulk layer is dependent upon the concentration of vacancies.

The present invention is also directed to a process for the preparation of a single crystal silicon wafer having a controlled oxygen precipitation behavior. The process comprises selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, and a bulk layer which comprises the region of the wafer between the central plane and the front surface layer.

The wafer is heated to an annealing temperature $T_A$ that is at least about 1300° C. to form crystal lattice vacancies in the front surface and bulk layers. The heated wafer is cooled from $T_A$ to an upper nucleation temperature $T_U$ that is between about 1020 and about 1090° C. at a rate R that is between about 40 and 50° C./sec to form a vacancy concentration profile in the wafer wherein the peak density of vacancies is in the bulk layer with the concentration generally decreasing from the location of the peak density in the direction of the front surface of the wafer. The vacancy concentration profiled wafer is maintained within a nucleation temperature range that is bounded by $T_U$ and a lower nucleation temperature $T_L$ that is between about 1000 and about 1080° C. wherein the difference between $T_U$ and $T_L$ is no greater than about 20° C. and generally decreases as $T_U$ and $T_L$ increase. The wafer is maintained with the nucleation temperature range for a nucleation duration $t_n$ that is between about 10 and about 30 seconds to form oxygen precipitate nucleation centers in the bulk layer that are incapable of being dissolved at temperatures below about 1150° C. and a region free of oxygen precipitate nucleation centers in the surface layer, with the concentration of oxygen precipitate nucleation centers in the bulk layer being dependent upon the concentration of vacancies.

Additionally, the present invention is directed to a process for the preparation of a single crystal silicon wafer having a controlled oxygen precipitation behavior. The process comprises selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, and a bulk layer which comprises the region of the wafer between the central plane and the front surface layer. The wafer is then heated to an annealing temperature $T_A$ that is at least about 1350° C. to form crystal lattice vacancies in the front surface and bulk layers. The heated wafer is cooled from $T_A$ to an upper nucleation temperature $T_U$ that is between about 1060 and about 1090° C. at a rate R that is between about 40 and 50° C./sec to form a vacancy concentration profile in the wafer wherein the peak density of vacancies is in the bulk layer with the concentration generally decreasing from the location of the peak density in the direction of the front surface of the wafer. The vacancy concentration profiled wafer is maintained within a nucleation temperature range bounded by $T_U$ and a lower nucleation temperature $T_L$ that is between about 1050 and about 1080° C. wherein the difference between $T_U$ and $T_L$ is no greater than about 15° C. and generally decreases as $T_U$ and $T_L$. The wafer is maintained with the nucleation temperature range for a nucleation duration $t_n$ that is between about 10 and about 15 seconds to form oxygen precipitate nucleation centers in the bulk layer that are incapable of being dissolved at temperatures below about 1150° C. and a region free of oxygen precipitate nucleation centers in the surface layer, with the concentration of oxygen precipitate nucleation centers in the bulk layer being dependent upon the concentration of vacancies.

In yet another embodiment, the present invention is directed to a process for the preparation of a single crystal silicon wafer having a controlled oxygen precipitation behavior. The process comprises selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, a bulk layer which comprises the region of the wafer between the central plane and the front surface layer and a native oxide layer on the front and back surfaces. The wafer is heated to an annealing temperature $T_A$ to form crystal lattice vacancies in the front surface and bulk layers while exposing the wafer to an atmosphere comprising nitrogen or a nitrogen-containing gas. The heated wafer is cooled from $T_A$ to an upper nucleation temperature $T_U$ at a rate R to form a vacancy concentration profile in the wafer wherein the peak density of vacancies is in the bulk layer with the concentration generally decreasing from the location of the peak density in the direction of the front surface of the wafer. The vacancy concentration profiled wafer is maintained within a nucleation temperature range bounded by $T_U$ and a lower nucleation temperature $T_L$ for a nucleation duration $t_n$ to form oxygen precipitate nucleation centers in the bulk layer that are incapable of being dissolved at temperatures below about 1150° C. and a region free of oxygen precipitate nucleation centers in the surface layer, with the concentration of oxygen precipitate nucleation centers in the bulk layer being dependent upon the concentration of vacancies.

Other objects and features of this invention will be in part apparent and in part pointed out hereinafter.

DETAILED DESCRIPTION OF THE INVENTION

Figure 1:
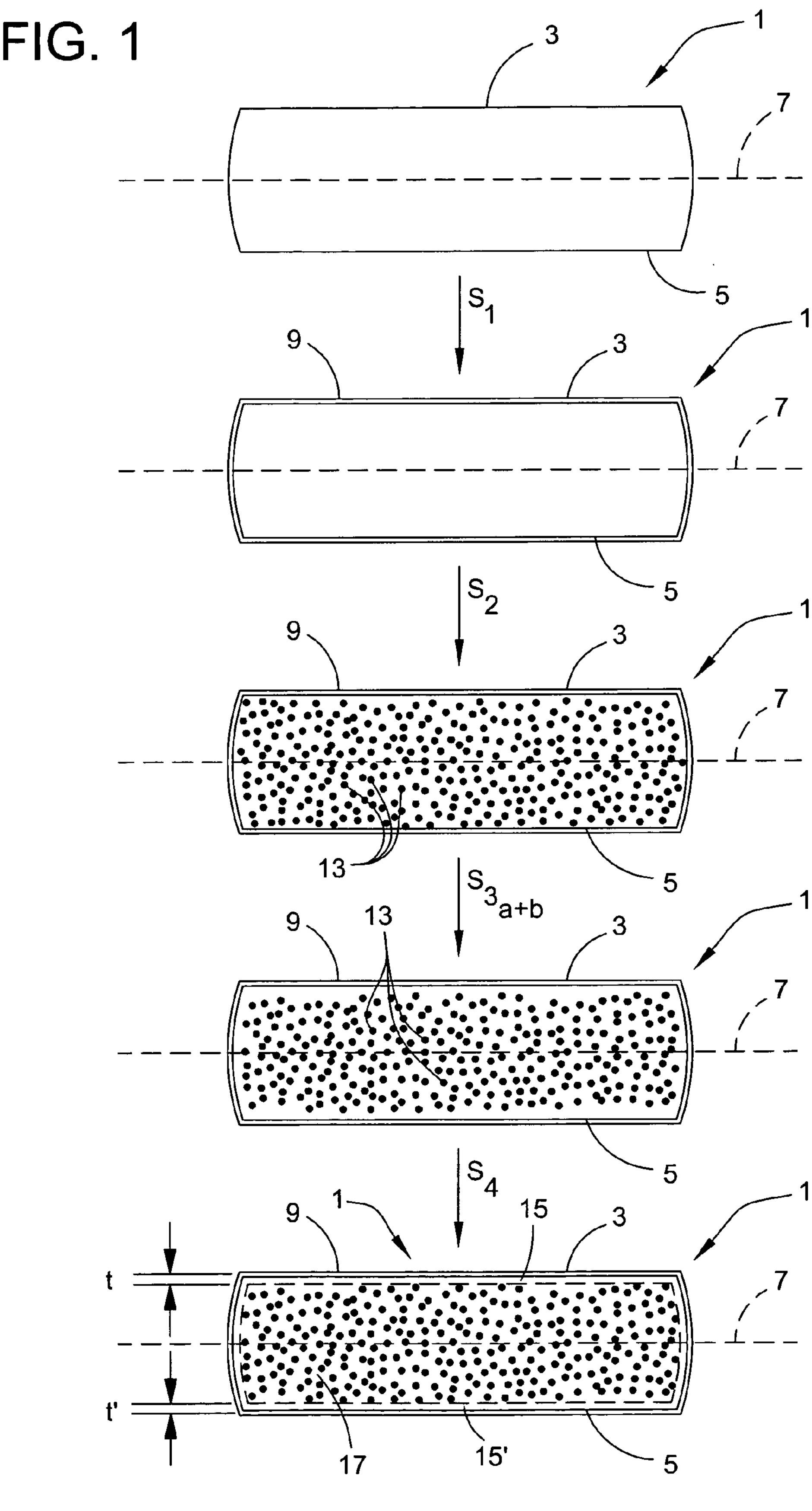
FIG. 1 is a schematic depiction of the process of the present invention.

In accordance with the present invention, an ideal precipitating wafer has been discovered which, during essentially any electronic device manufacturing process, will form a denuded zone, or precipitate-free region, of sufficient depth and a wafer bulk containing a sufficient density of oxygen precipitates for intrinsic gettering purposes. Advantageously, this ideal precipitating wafer may be prepared in a matter of minutes using tools which are in common use in the semiconductor silicon manufacturing industry. This process creates a "template" in the silicon which determines or "prints" the manner in which oxygen will ultimately precipitate. In accordance with the present invention, the process for forming this template is controlled so that oxygen precipitate nucleation centers formed in the wafer bulk are stabilized such that they may survive a subsequent rapid thermal heat treatment (e.g., epitaxial deposition and/or oxygen implantation) without an intervening thermal stabilization anneal. Stated another way, the oxygen precipitate nucleation centers formed during the process of the present invention are large enough not to dissolve if the wafer is rapidly heated to temperatures not in excess of about 1150° C.

A. Starting Material

The starting material for the ideal precipitating wafer of the present invention is a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). The starting material for the process of the present invention may be a polished silicon wafer, or alternatively, a silicon wafer which has been lapped and etched but not polished. In addition, the wafer may have vacancy or self-interstitial point defects as the predominant intrinsic point defect. For example, the wafer may be vacancy dominated from center to edge, self-interstitial dominated from center to edge, or it may contain a central core of vacancy dominated material surrounded by an axially symmetric ring of self-interstitial dominated material.

Czochralski-grown silicon typically has an oxygen concentration within the range of about $5\times10^{17}$ to about $9\times10^{7}$ atoms/cm$^3$ (ASTM standard F-121-83). Because the oxygen precipitation behavior of the wafer becomes essentially decoupled from the oxygen concentration in the ideal precipitating wafer, the starting wafer may have an oxygen concentration falling anywhere within or even outside the range attainable by the Czochralski process.

During the growth of a silicon single crystal ingot, the silicon is cooled from its melting temperature (about 1410° C.) and as the silicon cool is cooled through the temperature range of about 700° C. to about 350° C., vacancies and oxygen can interact to form oxygen precipitate nucleation centers in the ingot. Certain heat treatments, such as annealing the silicon at a temperature of about 800° C. for about four hours, can stabilize these centers such that they are incapable of being dissolved at temperatures not in excess of about 1150° C. In accordance with the present invention, the presence or absence of nucleation centers in the starting material is not critical because they are capable of being dissolved by heat-treating the silicon at a temperature between about 1150° C. and about 1300° C. Although the presence (or density) of oxygen precipitation nucleation centers cannot be directly measured using presently available techniques, their presence may be detected by subjecting the silicon wafer to an oxygen precipitation heat treatment such as annealing the wafer at a temperature of 800° C. for four hours to stabilize the nucleation centers and then at a temperature of 1000° C. for sixteen hours to grow the centers to precipitates. The detection limit for oxygen precipitates is currently about $5\times10^{6}$ precipitates/cm$^3$.

Substitutional carbon, when present as an impurity in single crystal silicon, has the ability to catalyze the formation of oxygen precipitate nucleation centers. For this and other reasons, therefore, it is preferred that the single crystal silicon starting material has a low concentration of carbon. That is, the single crystal silicon should have a concentration of carbon which is less than about $5\times10^{16}$ atoms/cm$^3$, preferably which is less than $1\times10^{16}$ atoms/cm$^3$, and more preferably less than $5\times10^{15}$ atoms/cm$^3$.

Referring now to FIG. 1, the starting material for the ideal precipitating wafer of the present invention, single crystal silicon wafer 1, has a front surface 3, a back surface 5, and an imaginary central plane 7 between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation (TTV), warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

B. Forming Vacancies in the Silicon Wafer

In accordance with the present invention, the wafer is subjected to a heat treatment step, step $S_2$ (optional step $S_1$ is described in greater detail below), in which the wafer is heated to an elevated temperature to form and thereby increase the number density of crystal lattice vacancies 13 in wafer 1. Preferably, this heat treatment step is carried out in a rapid thermal annealer in which the wafers are rapidly heated to a target annealing temperature $T_A$ and annealed at that temperature for a relatively short period of time. For example, a rapid thermal annealer (RTA) is capable of heating a wafer from room temperature to 1200° C. in a few seconds. One such commercially available RTA furnace is the model 2800 furnace available from STEAG AST Electronic GmbH (Dornstadt, Germany). In general, the wafer is subjected to a temperature in excess of 1150° C., but less than about 1400° C. Typically, the wafer is heated to a temperature between about 1200 and about 1400° C., and more typically between about 1250 and 1400° C. In one embodiment, $T_A$ is between about 1300 and about 1400° C. In another embodiment $T_A$ is between about 1350 and about 1400° C.

Intrinsic point defects (vacancies and silicon self-interstitials) are capable of diffusing through single crystal silicon with the rate of diffusion being temperature dependent. The concentration profile of intrinsic point defects, therefore, is a function of the diffusivity of the intrinsic point defects and the recombination rate as a function of temperature. For example, the intrinsic point defects are relatively mobile at temperatures in the vicinity of the temperature at which the wafer is annealed in the rapid thermal annealing step whereas they are essentially immobile for any commercially practical time period at temperatures of below about 700° C. Experimental evidence obtained to date suggests that the effective diffusion rate of vacancies may slow considerably even at temperatures as high as 800° C., 900° C., or even 1,000° C.

In addition to causing the formation of crystal lattice vacancies, the rapid thermal annealing step causes the dissolution of pre-existing oxygen precipitate nucleation centers which may be present in the silicon starting material. As set forth above, these nucleation centers may be formed, for example, during the growth of the single crystal silicon ingot from which the wafer was sliced, or as a consequence of some other event in the previous thermal history of the wafer or of the ingot from which the wafer is sliced.

During the heat treatment, the wafer may be exposed to an atmosphere comprising a gas or gasses selected to produce a vacancy concentration profile which is relatively uniform. In one embodiment a relatively uniform vacancy concentration profile may be produced by heat-treating the wafer 1 in a non-nitriding and non-oxidizing atmosphere (i.e., an inert atmosphere). When a non-nitrogen/non-oxygen-containing gas is used as the atmosphere or ambient in the rapid thermal annealing step and cooling step, the increase in vacancy concentration throughout the wafer is achieved soon after, if not immediately upon, achieving the annealing temperature. The profile of the resulting vacancy concentration (number density) in the wafer during the heat treatment is relatively constant from the front of the wafer to the back of the wafer. The wafer will generally be maintained at this temperature for at least one second, typically for at least several seconds (e.g., at least 3 seconds), preferably for several tens of seconds (e.g., 20, 30, 40, or 50 seconds) and, depending upon the desired characteristics of the wafer, for a period which may range up to about 60 seconds (which is near the limit for commercially available rapid thermal annealers). Maintaining the wafer in such an atmosphere at an established temperature during the anneal for additional time does not appear, based upon experimental evidence obtained to-date, to lead to an increase in vacancy concentration. Suitable gasses include argon, helium, neon, carbon dioxide, and other such inert elemental and compound gasses, or mixtures of such gasses.

Experimental evidence obtained to date suggests that the non-nitriding/non-oxidizing atmosphere preferably has no more than a relatively small partial pressure of oxygen, water vapor and other oxidizing gasses. That is, the atmosphere has a total absence of oxidizing gasses or a partial pressure of such gasses which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere has a partial pressure of oxygen and other oxidizing gasses of less than 0.01 atm. (10,000 ppma); more preferably the partial pressure of these gasses in the atmosphere is no more than about 0.005 atm. (5,000 ppma), more preferably no more than about 0.002 atm. (2,000 ppma), and most preferably no more than about 0.001 atm. (1,000 ppma).

In another embodiment a relatively uniform vacancy concentration profile may be produced by heat-treating the wafer 1 in an oxygen-containing atmosphere in step $S_1$ to grow a superficial oxide layer 9 which envelopes wafer 1 prior to step $S_2$. In general, the oxide layer will have a thickness which is greater than the native oxide layer which forms upon silicon (about 15 Å). In this second embodiment, the thickness of the oxide layer is typically at least about 20 Å. In some instances, the wafer will have an oxide layer that is at least about 25 or 30 Å thick. Experimental evidence obtained to date, however, suggests that oxide layers having a thickness greater than about 30 Å provide little or no additional benefit.

After forming the oxide layer, the rapid thermal annealing step is typically carried out in the presence of a nitriding atmosphere, that is, an atmosphere containing nitrogen gas ($N_2$) or a nitrogen-containing compound gas such as ammonia which is capable of nitriding an exposed silicon surface. Alternatively, or in addition, the atmosphere may comprise a non-oxidizing and non-nitriding gas such as argon. An increase in vacancy concentration throughout the wafer is achieved soon after, if not immediately upon, achieving the annealing temperature and the vacancy concentration profile is relatively uniform.

C. Cooling to Form a Non-uniform Vacancy Concentration Profile

Upon completion of step $S_2$, the wafer is rapidly cooled in step $S_{3a}$ through a range of temperatures at which crystal lattice vacancies are relatively mobile in the single crystal silicon in order to form a non-uniform vacancy concentration profile in the wafer. This range of temperatures may be referred to as a profile-formation temperature range which generally extends from the annealing temperature $T_A$ to a temperature within a nucleation temperature range within which the mobile crystal lattice vacancies oxidize, oxidized crystal lattice vacancies nucleate to form oxygen precipitate nucleation centers, and the oxygen precipitate nucleation centers can increase in size (described in detail below).

As the temperature of the wafer is decreased through the profile-formation temperature range, the vacancies diffuse to the surface of the wafer and/or the oxide layer on the wafer surface and become annihilated, thus leading to a change in the vacancy concentration profile with the extent of change depending upon the length of time the wafer is maintained at a temperature within this range. If the wafer was held at a temperature within this range for an infinite period of time, the vacancy concentration profile would once again become similar to the initial profile of step $S_2$ (e.g., uniform) but the equilibrium concentration would be less than the concentration immediately upon completion of the heat treatment step. By rapidly cooling the wafer, however, the distribution of crystal lattice vacancies in the near-surface region is significantly reduced which results in a modified vacancy concentration profile. For example, rapidly cooling a wafer initially having a uniform profile results in a non-uniform profile in which the maximum vacancy concentration is at or near central plane 7 and the vacancy concentration decreases in the direction of the front surface 3 and back surface 5 of the wafer.

Conveniently, the cooling step may be carried out in the same atmosphere in which the heating step is carried out. However, it may be carried out in a different atmosphere (see, infra, *F. RTA Formation of Non-uniform Vacancy Concentration Profiles*) which may modify the shape of the vacancy concentration profile. Regardless of the selected atmosphere, the effect of rapidly cooling the wafer predominates atmospheric factors and results in a significant decrease in the concentration of vacancies in the near surface regions.

In general, the average cooling rate R within this range of temperatures is at least about 5° C. per second and preferably at least about 20° C. per second. Depending upon the desired depth of the denuded zone, the average cooling rate may preferably be at least about 50° C. per second, still more preferably at least about 100° C. per second, with cooling rates in the range of about 100 to about 200° C. per second being preferred for some applications. Typically, current processing equipment results in a cooling rate that is in between about 30 and about 80° C. per second and more typically between about 40 and about 50° C. per second.

D. Forming Stabilized Oxygen Precipitate Nucleation Centers

After rapidly cooling the wafer to form the non-uniform vacancy concentration profile in step $S_{3a}$, step $S_{3b}$ comprises maintaining the wafer in, and/or controlling the cooling of the wafer through, a range of temperatures so that mobile crystal lattice vacancies oxidize, the oxidized crystal lattice vacancies nucleate to form oxygen precipitate nucleation centers, and the oxygen precipitate nucleation centers can increase in size. During step $S_{3b}$, the wafer is maintained in, and/or cooled through, this so called nucleation temperature range $T_n$ for a duration $t_n$ sufficient for the oxygen precipitates to become stabilized (i.e., the oxygen precipitates are of a size that is incapable of being dissolved at temperatures up to about 1150° C.).

Without being bound to a particular theory, the process of the present invention is believed to form stabilized oxygen precipitate nucleation centers according to the following description. The vacancy concentration $C_{vo}$ incorporated into a wafer by rapid thermal annealing is the difference of the two equilibrium concentrations at the temperature ($T_A$): that of vacancies ($C_{ve}$), and that of self-interstitials ($C_{ie}$).

$$C_{vo}=C_{ve}(T_A)-C_{ie}(T_A). \quad (1)$$

During the rapid thermal anneal, $T_A$ does not come close to approaching the melting point of silicon so the value of $C_{vo}$ is relatively low (less than of $10^{13}$ $cm^{-3}$)—substantially lower than that incorporated by the crystal growth (on the order of $10^{14}$ $cm^{-3}$). At low $C_{vo}$, void formation is suppressed, mostly due to vacancy binding by oxygen to form oxide particles (a joint agglomeration of oxygen atoms and vacancies). In silicon subjected to a process similar to that of the present invention except without step $S_{3b}$, the size of the oxide particles is just several atoms because of the high cooling rate (e.g., 20–50° C./s) in order to prevent the out-diffusion of vacancies. In contrast, after forming the vacancy concentration profile by rapidly cooling the wafer during step $S_{3a}$, step $S_{3b}$ of the present invention balances the phenomenon of oxide particle nucleation and growth in the wafer bulk where the initial vacancy concentration is close to $C_{vo}$ against the tendency of vacancies to out-diffuse toward the wafer surface. Thus, depending on the annealing temperature and the concentration of vacancies within the silicon, the nucleation temperature range and the nucleation duration $t_n$ are selected so that the vacancy-related reactions (e.g., oxidation, nucleation and growth) proceed without allowing the installed vacancy concentration profile to substantially relax. For example, the nucleation temperature range and nucleation duration are typically controlled so that the diffusion length for vacancies and/or oxidized vacancies during this nucleation/growth portion of the process is less than about 200 μm.

A mathematical model is set forth below that was used to determine semi-quantitative estimates of the oxide particle nucleation and vacancy out-diffusion phenomena. First, the density and size of the oxide particles for the wafer bulk neglecting any out-diffusion of vacancies were calculated. Nucleation lasts for some characteristic time τ; at a longer time, the nucleation rate is severely diminished due to vacancy consumption by the growing particles. According to this process, a certain density of oxygen particles is produced, and a substantial fraction of the vacancies is consumed by the formation of the oxygen particles. If the holding time $t_n$ were chosen substantially longer than τ, the remaining vacancies would be also consumed by the growing particles, and the particles would reach some maximum size. However, there is no need to hold the wafer for a time substantially longer than τ in order to continue the growth of the particles because the continued growth will occur during a subsequent heat treatment (e.g., during epitaxial deposition). Thus the holding time $t_n$ at the nucleation temperature $T_n$ was selected to be identical to τ.

The density and size of particles formed during step $S_{3b}$ depend on the incorporated vacancy concentration $C_{vo}$ and on the holding temperature $T_n$. The size of the particles should be sufficient for the particles to survive at a subsequent rapid high temperature heat treatment such as epitaxial deposition. At present, this size is believed to be about 1000 consumed vacancies per one particle which corresponds to the critical size of a non-strained oxide particle at about 1150° C. in silicon comprising an oxygen concentration of about $8\times10^{17}$ $cm^{-3}$. The specific surface energy value was selected to be about 850 $erg/cm^2$ based on a published analysis of oxide particle nucleation. The criterion for the particle size may be translated into the requirement of a not very high particle density N, because the particle size m (the number of consumed vacancies) is equal to $C_{vo}/N$. In other words, N was selected to be less than $C_{vo}/1000$. A holding temperature that is too low results in a precipitate density that is too high, and accordingly, particles that are too small to withstand a subsequent rapid thermal treatment. Thus, to meet the size criterion, $T_n$, is at least as great as some lower temperature limit.

The produced particle density N, which depends on the initial vacancy concentration $C_{vo}$ and $T_n$ is determined by solving the vacancy loss equation:

$$dC_v/dt=-4\pi D_{ox}\gamma\int I(t')R(t',t)dt' \quad (2)$$

assuming that the particle growth rate is limited by diffusion of oxygen to the spherical particle. In this equation, I is the nucleation rate at some moment t', R is the radius of a particle that was nucleated at the moment t' and was growing during the period from t' to the current moment t, $D_{ox}$, is the oxygen diffusivity, and γ is the number of consumed vacancies per one consumed oxygen atom (γ is about 0.5). Integration over time, in Eq.(2), is from 0 to t. The nucleation rate of oxide particles I is specified by a conventional expression for the steady-state nucleation rate. Nucleation, in this case, is a random walk along the size axis n (the number of oxygen atoms in a cluster) while the number of currently consumed vacancies is a function of n, T, and $C_v$. The current vacancy concentration $C_v$ is composed of all forms of vacancies—both free vacancies and the vacancy-oxygen species $VO_2$ (bound vacancies). The nucleation is controlled by the free vacancies that constitute a certain fraction of $C_v$ that depends on T and on the oxygen concentration $C_{ox}$. For $C_{ox}$, a fixed value of $8\times10^{17}$ $cm^{-3}$ was adopted.

After integration of Eq.(2), both the time dependence of $C_v$ and of the nucleation rate I are obtained. The particle density N is found by integrating I over time. The characteristic nucleation time τ is simultaneously defined by the shape of I(t) curve. For a specified anneal temperature $T_A$ (and thus for a corresponding vacancy concentration $C_{vo}$), the criterion of sufficiently large maximum size ($N/1000<C_{vo}$) is fulfilled only if the nucleation temperature $T_n$ is as high as the lower nucleation temperature $T_L$. If $T_n$ is below $T_L$, the particle size becomes too small to meet the size criterion. This calculated lower nucleation temperature $T_L$ is shown by the size limitation curve of FIG. 2.

On the other hand, the holding temperature $T_n$ should be sufficiently low, to prevent a substantial out-diffusion of vacancies from the wafer bulk before an appreciable amount of particle nucleation can occur. This (second) criterion for the holding temperature implies that the vacancy out-diffusion length, during the holding time (which is equal to the nucleation time τ) should be substantially less than the wafer half-width. To quantify the criterion, it was adopted that the out-diffusion length, $(2\,D_{eff}\,\tau)^{1/2}$, should be less than 200 μm. Here $D_{eff}$ is the effective diffusivity of vacancy community that consists of highly mobile free vacancies and immobile trapped (bound) vacancy species, $VO_2$. Thus $D_{eff}$ is equal to the free vacancy diffusivity D, multiplied by the fraction of free vacancies among the vacancy species. At a relatively low $T_n$, the free vacancy fraction is low, and $D_{eff}$ is accordingly low and vacancy out-diffusion is insignificant. However, at a relatively high $T_n$, the out-diffusion is fast. To meet the above criterion of not having a substantial out-diffusion of vacancies, the holding temperature is at most the upper nucleation temperature $T_U$. The calculated $T_U$ is depicted as the out-diffusion limitation curve of FIG. 2.

Thus, the nucleation temperature range comprises an upper nucleation temperature $T_U$ which corresponds to the temperature at which the vacancies become so mobile that the non-uniform vacancy concentration profile cannot be substantially maintained (i.e., the rapid cooling induced non-uniform profile relaxes such that the shape of concentration profile approaches or resembles the profile during the anneal step $S_2$). The nucleation temperature range also comprises a lower nucleation temperature $T_L$ which corresponds to the lowest temperature at which the vacancies and/or oxidized vacancies have sufficient mobility to form oxygen precipitate nucleation centers that are large enough to be considered stabilized.

Figure 2:
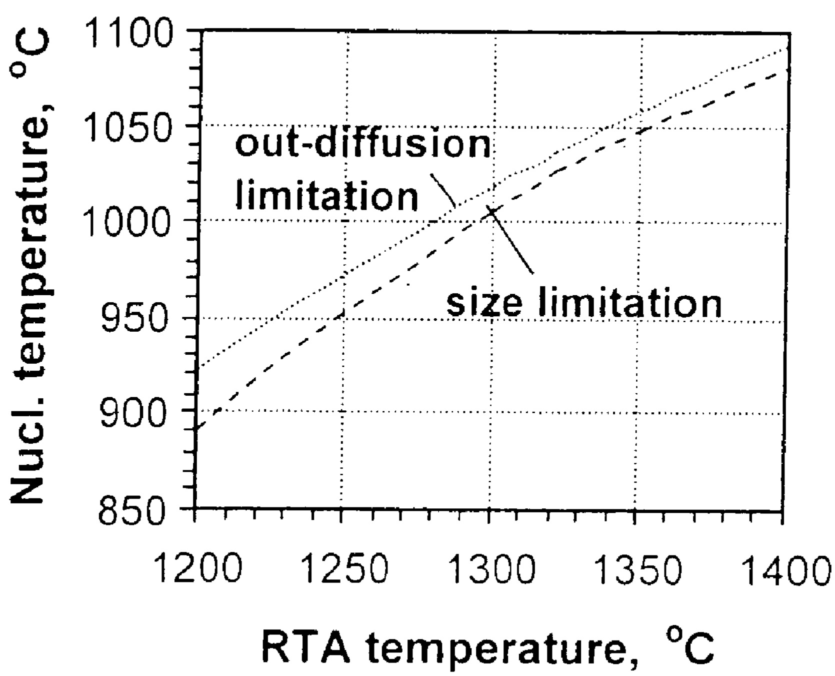
FIG. 2 is a graph depicting the nucleation temperature range of the present invention in which crystal lattice vacancies are oxidized and nucleate as a function of the RTA temperature used to form the crystal lattice vacancies.

Referring to FIG. 2, the upper and lower nucleation temperatures are primarily a function of the vacancy concentration $C_{vo}$ which is based in large part on the annealing temperature $T_A$. Generally, the upper and lower nucleation temperatures increase with increasing annealing temperatures and vacancy concentrations. Also, the difference between the upper and lower limits tends to decrease with increasing annealing temperatures because the long range transport of vacancies increases with temperature which increases the likelihood of profile relaxation prior to nucleation. The FIG. 2 plot is based on the assumptions set forth above including: forming oxygen precipitate nucleation centers large enough to withstand being rapidly heated to a temperature greater than about 1150° C. which is presently believed that require at least about 1000 vacancies; an oxygen concentration $C_{ox}$ of $8\times10^{17}$ $cm^{-3}$; and an atmosphere during the process that is neutral (i.e., an atmosphere that does not create, or inject, vacancies in the wafer such as the non-nitriding/non-oxidizing atmosphere described above). If, however, the oxygen precipitate nucleation centers need only withstand being rapidly heated to a temperature less than about 1150° C., the lower nucleation temperature may be decreased.

In view of the foregoing, during step $S_{3b}$ the vacancies and interstitial oxygen in the wafer interact to form oxygen precipitate nucleation centers. The concentration of the oxygen precipitate nucleation centers depends primarily upon the vacancy concentration, and as such, the profile of the oxygen precipitate nucleation centers resembles the vacancy profile. Specifically, in the high vacancy regions (the wafer bulk), oxygen precipitate nucleation centers are formed and in the low vacancy regions (near the wafer surfaces) oxygen precipitation nucleation centers are not formed. Thus, by dividing the wafer into various zones of vacancy concentration, a template of oxygen precipitation nucleation centers is created. Additionally, the distribution of oxygen precipitate nucleation centers in the wafer bulk corresponds to that of the vacancies. That is, it is non-uniform and may have profiles which may be characterized as, for example, having a maximum concentration at some point in the bulk and decreasing in the direction of the front and back surfaces (e.g., "upside down U-shaped").

Figure 3:
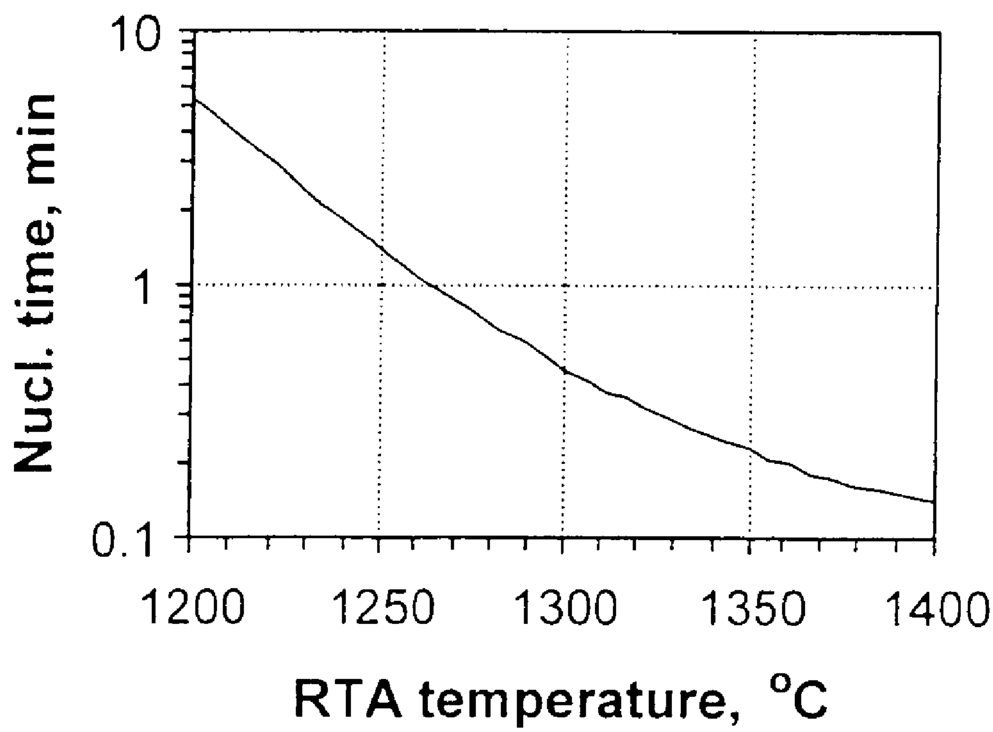
FIG. 3 is a graph depicting the time required in the nucleation temperature range of the present invention to form stabilized oxygen precipitates.

In further calculations, the nucleation temperature $T_n$ was assumed to be midway between $T_L$ and $T_U$ as depicted in FIG. 2. For example, the nucleation duration set forth in FIG. 3 is the time needed to grow oxygen precipitate nucleation centers stabilized to about 1150° C. at a temperature $T_n$, that is about midway between $T_U$ and $T_L$. The nucleation duration $t_n$ is also based on the vacancy concentration $C_{vo}$. Both $T_n$, and $C_{vo}$ may be specified as a function of the annealing temperature $T_A$, and as such $t_n$ is depicted as a function of $T_A$ in FIG. 3. If, however, the oxygen precipitates need only withstand being rapidly heated to a temperature less than about 1150° C., the nucleation duration may be decreased.

In an embodiment of the present invention, $T_A$ is between about 1200 and about 1400° C., $T_U$ is between about 920 and about 1090° C., $T_L$ is between about 890 and about 1080° C., the difference between the $T_U$ and $T_L$ is less than about 40° C., and $t_n$ is between about 10 seconds and about 6 minutes. In another embodiment $T_A$ is between about 1250 and about 1400° C., $T_U$ is between about 970 and about 1090° C., $T_L$ is between about 950 and about 1080° C., the difference between the $T_U$ and $T_L$ is less than about 25° C., and $t_n$ is between about 10 seconds and about 90 seconds. In yet another embodiment $T_A$ is between about 1300 and about 1400° C., $T_U$ is between about 1020 and about 1090° C., $T_L$ is between about 1000 and about 1080° C., the difference between the $T_U$ and $T_L$ is less than about 20° C., and $t_n$ is between about 10 seconds and about 30 seconds. In still another embodiment $T_A$ is between about 1350 and about 1400° C., $T_U$ is between about 1060 and about 1090° C., $T_L$ is between about 1050 and about 1080° C., the difference between the $T_U$ and $T_L$ is less than about 15° C., and $t_n$ is between about 10 seconds and about 15 seconds.

After step $S_{3b}$, the wafer has a surface layer which comprises the region of the wafer between the front surface and a distance measured from the front surface and toward the central plane, wherein the surface layer is free of oxygen precipitate nucleation centers and a bulk layer which comprises a second region of the wafer between the central plane and the first region, wherein the bulk layer comprises stabilized oxygen precipitate nucleation centers. As such, the stabilized oxygen precipitation nucleation centers can withstand a subsequent thermal process such as epitaxial deposition. Referring to FIG. 1, after step $S_{3b}$, the resulting depth distribution of stabilized oxygen precipitate nucleation centers in the wafer is characterized by regions 15 and 15' extending from the front surface 3 and back surface 5 to a depth t, t', respectively, that are free of oxygen precipitate nucleation centers and region 17 between regions 15 and 15' that contains stabilized oxygen precipitate nucleation centers.

E. Growth of Oxygen Precipitates

In step $S_4$, the wafer is subjected to an oxygen precipitate growth heat treatment to grow the oxygen precipitation nucleation centers into oxygen precipitates. For example, the wafer may be annealed at a temperature between about 800 and about 1000° C. for sixteen hours. Alternatively and preferably, the wafer is loaded into a furnace that is heated to between about 800 and about 1000° C. as the first step of an electronic device manufacturing process. As the temperature is increased to 800° C. or higher, the oxygen precipitation nucleation clusters continue to grow into precipitates by consuming vacancies and interstitial oxygen, whereas in the region near the surface(s) where oxygen precipitation nucleation centers were not formed and nothing happens.

As illustrated in FIG. 1, the resulting depth distribution of oxygen precipitates in the wafer is characterized by clear regions of oxygen precipitate-free material (denuded zones)

15 and 15' extending from the front surface 3 and back surface 5 to a depth t, t', respectively. Between the oxygen precipitate-free regions, 15 and 15', there is a region 17 which contains a concentration profile of oxygen precipitates that is non-uniform having a profile that depends upon the profile of the vacancies as described above.

Figure 4:
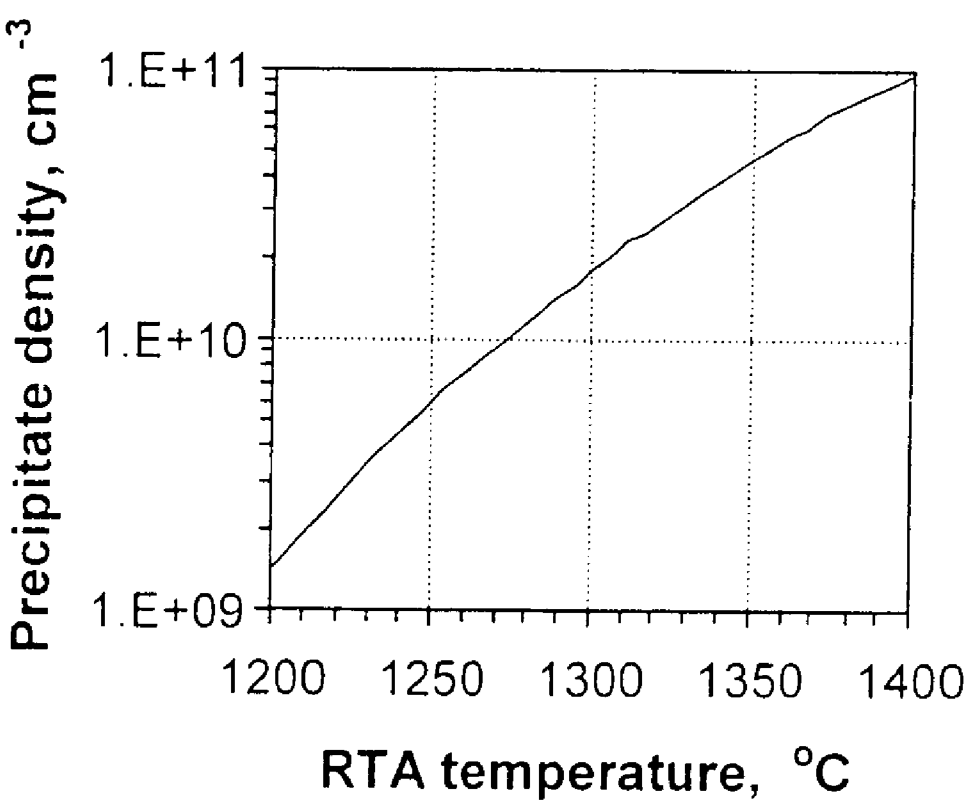
FIG. 4 is a graph depicting the density of precipitates formed in the bulk of a silicon wafer treated in accordance with the present invention as a function of the RTA temperature used to form the crystal lattice vacancies.

The concentration of oxygen precipitates in region 17 is primarily a function of the heating step and secondarily a function of the cooling rate. In general, the concentration of oxygen precipitates increases with increasing temperature and increasing annealing times in the heating step, with precipitate densities in the range of about $1\times10^9$ to about $1\times10^{10}$ precipitates/$cm^3$ being routinely obtained (see, FIG. 4 in which the computed particle, or precipitate, density is provided as a function of annealing temperature $T_A$ and is based on the assumptions set forth above including maintaining the wafer at a nucleation temperature midway between $T_L$ and $T_U$ as depicted in FIG. 2). The process of the present invention is typically performed so that the density of oxygen precipitates is at least about $1\times10^7$ precipitates/$cm^3$ and not greater than about $1\times10^{11}$ precipitates/$cm^3$. In another embodiment the density of oxygen precipitates is at least about $1\times10^8$ precipitates/$cm^3$ (which is currently believed to be the intrinsic gettering threshold). In yet another embodiment the density is at least about $1\times10^9$ precipitates/$cm^3$.

The depth t, t' from the front and back surfaces, respectively, of oxygen precipitate-free material (denuded zones) 15 and 15' is primarily a function of the cooling rate through the temperature range at which crystal lattice vacancies are relatively mobile in silicon. In general, the depth t, t' increases with decreasing cooling rates, with denuded zone depths of at least about 10, 20, 30, 40, 50, 70, or even 100 micrometers being attainable. Significantly, the depth of the denuded zone is essentially independent of the details of the electronic device manufacturing process and, in addition, does not depend upon the out-diffusion of oxygen as is conventionally practiced. As a practical matter, however, the cooling rate required to obtain shallow denuded zone depths are somewhat extreme and the thermal shock may create a risk of shattering the wafer. Alternatively, therefore, the thickness of the denuded zone may be controlled by selection of the ambient in which the wafer is annealed (see, supra) while allowing the wafer to cool at a less extreme rate. Stated another way, for a given cooling rate, an ambient may be selected which creates a template for a deep denuded zone (e.g., 50+ microns), intermediate denuded zones (e.g., 30–50 microns), shallow denuded zones (e.g., less than about 30 microns), or even no denuded zone. In this regard, the precise conditions of the annealing and cooling steps may be other than herein described without departing from the scope of the present invention. Furthermore, such conditions may be determined, for example, empirically by adjusting the temperature and duration of the anneal, and the atmospheric conditions (i.e., the composition of the atmosphere, as well as the oxygen partial pressure) in order to optimize the desired depth of t and/or t'.

While the rapid thermal treatments employed in this process of the present invention may result in the out-diffusion of a small amount of oxygen from the surface of the front and back surfaces of the wafer, the amount of out-diffusion is significantly less than what is observed in conventional processes for the formation of denuded zones. As a result, the ideal precipitating wafers of the present invention have a substantially uniform interstitial oxygen concentration as a function of distance from the silicon surface. For example, prior to the oxygen precipitation heat treatment, the wafer will have a substantially uniform concentration of interstitial oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface, and most preferably from the center of the silicon to regions of the wafer which are within about 3 microns of the silicon surface. In this context, a substantially uniform oxygen concentration shall mean a variance in the oxygen concentration of no more than about 50%, preferably no more than about 20%, and most preferably no more than about 10%.

Typically, oxygen precipitation heat treatments do not result in a substantial amount of oxygen outdiffusion from the heat-treated wafer. As a result, the concentration of interstitial oxygen in the denuded zone at distances more than several microns from the wafer surface will not significantly change as a consequence of the precipitation heat treatment. For example, if the denuded zone of the wafer consists of the region of the wafer between the surface of the silicon and a distance D (which is at least about 10 micrometers) as measured from the front surface and toward the central plane, the oxygen concentration at a position within the denuded zone which is at a distance from the silicon surface equal to one-half of D will typically be at least about 75% of the peak concentration of the interstitial oxygen concentration anywhere in the denuded zone. For some oxygen precipitation heat treatments, the interstitial oxygen concentration at this position will be even greater, i.e., at least 85%, 90% or even 95% of the maximum oxygen concentration anywhere in the denuded zone.

F. RTA Formation of Non-uniform Vacancy Concentration Profiles

As an alternative to the above-described embodiments in which the wafer is exposed to an atmosphere comprising a gas or gasses selected to produce a relatively uniform vacancy concentration profile, the gas or gasses of the atmosphere to which the wafer is exposed may be selected to impart a non-uniform vacancy concentration profile during steps 2, 3*a*, and/or 3*b*. For example, in one embodiment a non-uniform vacancy concentration profile may be produced by heat-treating a starting wafer having no more than a native oxide layer in a nitriding atmosphere. Specifically, exposing the front and back surfaces of such a wafer to nitrogen results in a vacancy concentration (number density) profile which is generally "U-shaped" for a cross-section of the wafer. That is, a maximum concentration of vacancies will occur at or within several micrometers of the front and back surfaces and a relatively constant and lesser concentration will occur throughout the wafer bulk with the minimum concentration in the wafer bulk initially being approximately equal to the concentration which is obtained in wafers having an enhanced oxide layer. Furthermore, an increase in annealing time will result in an increase in vacancy concentration in wafers lacking anything more than a native oxide layer.

Accordingly, referring again to FIG. 1, when a segment having only a native oxide layer is annealed in accordance with the present process under a nitriding atmosphere, the resulting peak concentration, or maximum concentration, of vacancies will initially be located generally within regions 15 and 15', while the bulk 17 of the silicon segment will contain a comparatively lower concentration of vacancies and nucleation centers. Typically, these regions of peak concentration will be located within several microns (e.g., about 5 or 10 microns), or tens of microns (e.g., about 20 or 30 microns), up to about 40 to about 60 microns, from the silicon segment surface.

In other embodiments the front and back surfaces of the wafer may be exposed to different atmospheres, each of which may contain one or more nitriding, non-nitriding, oxidizing, non-oxidizing gases. For example, the back surface of the wafer may be exposed to a nitriding atmosphere as the front surface is exposed to a non-nitriding atmosphere. Wafers subjected to a thermal treatment having different atmospheres may have an asymmetric vacancy concentration profile depending on the condition of each surface and the atmosphere to which it is exposed. For example, if the front surface lacks anything more than a native oxide layer and the back surface has an enhanced oxide layer and the wafer is thermally treated in a nitriding atmosphere, the vacancy concentration in the front portion of the wafer will be more similar to the "U-shaped" profile while the back portion of the wafer will be more uniform in nature. Alternatively, multiple wafers (e.g., 2, 3 or more wafers) may be simultaneously annealed while being stacked in a face-to-face arrangement; when annealed in this manner, the faces which are in face-to-face contact are mechanically shielded from the atmosphere during the annealing. Alternatively, and depending upon the atmosphere employed during the rapid thermal annealing step and the desired oxygen precipitation profile of the wafer, the oxide layer may be formed only upon one surface of the wafer (e.g., the front surface 3).

As the temperature of the wafer is decreased through the profile-formation temperature range of step 3*a*, the vacancies diffuse to the surface of the wafer and/or the oxide layer on the wafer surface and become annihilated, thus leading to a change in the vacancy concentration profile with the extent of change depending upon the length of time the wafer is maintained at a temperature within this range. If the wafer was held at a temperature within this range for an infinite period of time, the vacancy concentration profile would once again become similar to the initial profile of step $S_2$ (e.g., "U-shaped" or asymmetric depending on the degree of oxide on the wafer surface and/or atmosphere) but the equilibrium concentration would be less than the concentration immediately upon completion of the heat treatment step. By rapidly cooling the wafer, however, the distribution of crystal lattice vacancies in the near-surface region is significantly reduced which results in a modified vacancy concentration profile. For example, rapidly cooling a wafer initially having a "U-shaped" profile will have a "M-shaped" profile. That is, the vacancy concentration profile will have a local minimum concentration near the central plane 7 similar to the U-shaped profile prior to rapidly cooling the wafer, and two local maximum concentrations, one between the central plane 7 and the front surface 3 and one between the central plane 7 and the back surface 5 caused by the suppression of vacancies in the surface regions. Finally, if the vacancy concentration profile prior to cooling is asymmetric, the final concentration will have a local maximum between the central plane 7 and one surface 3 or 5, similar to the "M-shaped" profile and will generally decrease from the central plane 7 to the other surface 5 or 3 similar to the profile formed after cooling a uniform concentration profile.

As described in detail above, during step $S_{3b}$ the wafer is maintained in, and/or cooled through the nucleation temperature range for a duration $t_n$ sufficient for the oxygen precipitates to become stabilized (i.e., the oxygen precipitates are of a size that is incapable of being dissolved at temperatures up to about 1150° C.). The profile of the stabilized oxygen precipitates will be similar to profile formed by the rapid cooling. That is, the profile is non-uniform and may be characterized as, for example, having a maximum concentration at some point in the bulk and decreasing in the direction of the front and back surfaces (e.g., "M-shaped," or asymmetric).

Annealing a native oxide layer wafer in a nitriding atmosphere may be particularly preferred, in certain circumstances, because the increase in the concentration of vacancies may enhance the nucleation and growth of stabilized oxygen precipitates in step $S_{3b}$. Without being held to a particular theory, it is presently believed that the increase in the vacancy concentration (which is dependent upon, for example, temperature, time, and the partial pressure of the nitrogen-containing gas) tends to decrease the necessary nucleation duration described in step $S_{3b}$ below. Specifically, the increase in the concentration of vacancies tends to result in an increase of temperature for the onset of oxide particle nucleation and which tends to decrease the time necessary to form the oxygen precipitate nucleation centers. Referring to FIG. 2, increasing the vacancy concentration would tend to result in an upward shift of the "out-diffusion limitation" curve which is representative of non-oxidizing/non-nitriding atmosphere. Referring to FIG. 3, increasing the vacancy concentration would tend to result in a downward shift of the curve.

Experimental evidence suggests that the difference in behavior for wafers having no more than a native oxide layer and wafers having an enhanced oxide layer can be avoided by including molecular oxygen or another oxidizing gas in the atmosphere. Stated another way, when a wafer having no more than a native oxide layer is annealed in a nitrogen atmosphere containing a small partial pressure of oxygen, the wafer behaves the same as a wafer having an enhanced oxide layer (i.e., a relatively uniform concentration profile is formed in the heat-treated wafer). Without being bound to any theory, it appears that superficial oxide layers which are greater in thickness than a native oxide layer serve as a shield which inhibits nitridization of the silicon. This oxide layer may thus be present on the starting wafer or formed, in situ, by growing an enhanced oxide layer during the annealing step. If this is desired, the atmosphere during the rapid thermal annealing step preferably contains a partial pressure of at least about 0.0001 atm. (100 ppma), more preferably a partial pressure of at least about 0.0002 atm. (200 ppma). For the reasons set forth above, however, the partial pressure of oxygen preferably does not exceed 0.01 atm. (10,000 ppma), and is more preferably less than 0.005 atm. (5,000 ppma), still more preferably less than 0.002 atm. (2,000 ppma), and most preferably less than 0.001 atm. (1,000 ppma).

G. Epitaxial Layer

In one embodiment of the present invention, an epitaxial layer may be deposited upon the surface of an ideal precipitating wafer. The above-described oxygen precipitate nucleation and stabilization process of the present invention may be carried out either before or after the epitaxial deposition. Advantageously, the formation of stabilized oxygen precipitation nucleation centers allows for an epitaxial deposition process to be carried out without dissolving the installed precipitate profile.

The epitaxial layer will be formed by means conventionally known and used by those skilled in the art such as decomposition of a gas phase, silicon-containing composition. In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$ or $SiH_4$). The atmosphere also preferably contains a carrier gas (preferably $H_2$). In one embodiment, the source of silicon during the epitaxial deposition is $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the wafer surface is preferably maintained at a temperature sufficient to prevent the atmosphere comprising silicon from depositing polycrystalline silicon onto the surface a temperature of at least about 800° C., more preferably about 900° C., and most preferably about 1100° C. The rate of growth of the epitaxial deposition preferably is from about 0.5 to about 7.0 μm/min. A rate of from about 3.5 to 4.0 μm/min. may be achieved, for example, by using an atmosphere consisting essentially of about 2.5 mole % $SiHCl_3$ and about 97.5 mole % $H_2$ at a temperature of about 1150° C. and pressure of about 1 atm.

If desired, the epitaxial layer may additionally include a p-type or n-type dopant. For example, it is often preferable for the epitaxial layer to contain boron. Such a layer may be prepared by, for example, including $B_2H_6$ in the atmosphere during the deposition. The mole fraction of $B_2H_6$ in the atmosphere used to obtain the desired properties (e.g., resistivity) will depend on several factors, such as the amount of boron out-diffusion from the particular substrate during the epitaxial deposition, the quantity of p-type dopants and n-type dopants that are present in the reactor and substrate as contaminants, and the reactor pressure and temperature. For high resistivity applications, the dopant concentration in the epitaxial layer should be as low as practical.

H. Measurement of Crystal Lattice Vacancies

The measurement of crystal lattice vacancies in single crystal silicon can be carried out by platinum diffusion analysis. In general, platinum is deposited on the samples and diffused in a horizontal surface with the diffusion time and temperature preferably being selected such that the Frank-Turnbull mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes may be used, although more accurate tracking appears to be attainable at a lesser temperature, e.g., about 680° C. In addition, to minimize a possible influence by silicidation processes, the platinum deposition method preferably results in a surface concentration of less than one monolayer. Platinum diffusion techniques are described elsewhere, for example, by Jacob et al., *J. Appl. Phys.*, vol. 82, p. 182 (1997); Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and Zimmermann and Ryssel, *Appl. Phys. A*, vol. 55, p. 121 (1992).

It is to be understood that the above description is intended to be illustrative and not restrictive. Many embodiments will be apparent to those of skill in the art upon reading the above description. The scope of the invention should therefore be determined not with reference to the above description alone, but should also be determined with reference to the claims and the full scope of equivalents to which such claims are entitled.

We claim:

1. A process for the preparation of a single crystal silicon wafer having a controlled oxygen precipitation behavior, the process comprising the steps of:

selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, and a bulk layer which comprises the region of the wafer between the central plane and the front surface layer;

heating the wafer to an annealing temperature $T_A$ to form crystal lattice vacancies in the front surface and bulk layers;

cooling the heated wafer from $T_A$ to an upper nucleation temperature $T_U$ at a rate R to form a vacancy concentration profile in the wafer wherein the peak density of vacancies is in the bulk layer with the concentration generally decreasing from the location of the peak density in the direction of the front surface of the wafer; and controlling cooling of the vacancy concentration profiled wafer from an upper nucleation temperature $T_U$ to a lower nucleation temperature $T_L$ for a nucleation duration $t_n$ to form oxygen precipitate nucleation centers in the bulk layer that are incapable of being dissolved at temperatures below about 1150° C. and a region free of oxygen precipitate nucleation centers in the surface layer.

2. The process of claim 1 wherein $T_A$ is in excess of about 1150° C.

3. The process of claim 1 wherein $T_A$ is between about 1200 and about 1400° C.

4. The process of claim 1 wherein $T_A$ is between about 1250 and about 1400° C.

5. The process of claim 1 wherein $T_A$ is between about 1300 and about 1400° C.

6. The process of claim 1 wherein $T_A$ is between about 1350 and about 1400° C.

7. The process of claim 1 wherein R is at least about 5° C. per second.

8. The process of claim 1 wherein R is at least about 20° C. per second.

9. The process of claim 1 wherein R is at least about 50° C. per second.

10. The process of claim 1 wherein R is at least about 100° C. per second.

11. The process of claim 1 wherein R is between about 100 and about 200° C. per second.

12. The process of claim 1 wherein R is between about 30 and about 80° C. per second.

13. The process of claim 1 wherein R is between about 40 and about 50° C. per second.

14. The process of claim 1 wherein $T_U$ is between about 920 and about 1090° C., $T_L$ is between about 890 and about 1080° C., the difference between $T_U$ and $T_L$ is less than about 40° C. and generally decreases as $T_U$ and $T_L$ increase, and $t_n$ is between about 10 and about 360 seconds.

15. The process of claim 1 wherein $T_U$ is between about 970 and about 1090° C., $T_L$ is between about 950 and about 1080° C., the difference between $T_U$ and $T_L$ is less than about 25° C. and generally decreases as $T_U$ and $T_L$ increase, and $t_n$ is between about 10 and about 90 seconds.

16. The process of claim 1 wherein $T_U$ is between about 1020 and about 1090° C., $T_L$ is between about 1000 and about 1080° C., the difference between $T_U$ and $T_L$ is less than about 20° C. and generally decreases as $T_U$ and $T_L$ increase, and $t_n$ is between about 10 and about 30 seconds.

17. The process of claim 1 wherein $T_U$ is between about 1060 and about 1090° C., $T_L$ is between about 1050 and about 1080° C., and the difference between $T_U$ and $T_L$ is less than about 15° C. and generally decreases as $T_U$ and $T_L$ increase, and $t_n$ is between about 10 and about 15 seconds.

18. The process of claim 1 wherein, prior to the heat-treatment to form crystal lattice vacancies, the wafer is heated to a temperature of at least about 700° C. in an oxygen-containing atmosphere to form a superficial silicon dioxide layer which is capable of serving as a sink for crystal lattice vacancies.

19. The process of claim 1 comprising depositing an epitaxial layer on at least one surface of the wafer after formation of the stabilized oxygen precipitate nucleation centers form in the bulk layer.

20. A process for the preparation of a single crystal silicon wafer having a controlled oxygen precipitation behavior, the process comprising the steps of:

selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, and a bulk layer which comprises the region of the wafer. between the central plane and the front surface layer;

heating the wafer to an annealing temperature $T_A$ that is at least about 1300° C. to form crystal lattice vacancies in the front surface and bulk layers;

cooling the heated wafer from $T_A$ to an upper nucleation temperature $T_U$ that is between about 1020 and about 1090° C. at a rate R that is between about 40 and 50° C./sec to form a vacancy concentration profile in the wafer wherein the peak density of vacancies is in the bulk layer with the concentration generally decreasing from the location of the peak density in the direction of the front surface of the wafer; and controlling cooling of the vacancy concentration profiled wafer from an upper nucleation temperature $T_U$ to a lower nucleation temperature $T_L$ that is between about 1000 and about 1080° C. wherein the difference between $T_U$ and $T_L$ is no greater than about 20° C. and generally decreases as $T_U$ and $T_L$ increase for a nucleation duration $t_n$ that is between about 10 and about 30 seconds to form oxygen precipitate nucleation centers in the bulk layer that are incapable of being dissolved at temperatures below about 1150° C. and a region free of oxygen precipitate nucleation centers in the surface layer.

21. A process for the preparation of a single crystal silicon wafer having a controlled oxygen precipitation behavior, the process comprising the steps of:

selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, and a bulk layer which comprises the region of the wafer between the central plane and the front surface layer;

heating the wafer to an annealing temperature $T_A$ that is at least about 1350° C. to form crystal lattice vacancies in the front surface and bulk layers;

cooling the heated wafer from $T_A$ to an upper nucleation temperature $T_U$ that is between about 1060 and about 1090° C. at a rate R that is between about 40 and 50° C./sec to form a vacancy concentration profile in the wafer wherein the peak density of vacancies is in the bulk layer with the concentration generally decreasing from the location of the peak density in the direction of the front surface of the wafer; and controlling cooling of the vacancy concentration profiled wafer from an upper nucleation temperature $T_U$ to a lower nucleation temperature $T_L$ that is between about 1050 and about 1080° C. wherein the difference between $T_U$ and $T_L$ is no greater than about 15° C. and generally decreases as $T_U$ and $T_L$ increase for a nucleation duration $t_n$ that is between about 10 and about 15 seconds to form oxygen precipitate nucleation centers in the bulk layer that are incapable of being dissolved at temperatures below about 1150° C. and a region free of oxygen precipitate nucleation centers in the surface layer.

22. A process for the preparation of a single crystal silicon wafer having a controlled oxygen precipitation behavior, the process comprising the steps of:

selecting a wafer sliced from a single crystal silicon ingot grown by the Czochralski method comprising a front surface, a back surface, a central plane between the front and back surfaces, a front surface layer which comprises the region of the wafer between the front surface and a distance D measured from the front surface and toward the central plane, a bulk layer which comprises the region of the wafer between the central plane and the front surface layer and a native oxide layer on the front and back surfaces;

heating the wafer to an annealing temperature $T_A$ to form crystal lattice vacancies in the front surface and bulk layers while exposing the wafer to an atmosphere comprising nitrogen or a nitrogen-containing gas;

cooling the heated wafer from $T_A$ to an upper nucleation temperature $T_U$ at a rate R to form a vacancy concentration profile in the wafer wherein the peak density of vacancies is in the bulk layer with the concentration generally decreasing from the location of the peak density in the direction of the front surface of the wafer; and controlling cooling of the vacancy concentration profiled wafer from an upper nucleation temperature $T_U$ to a lower nucleation temperature $T_L$ for a nucleation duration $t_n$ to form oxygen precipitate nucleation centers in the bulk layer that are incapable of being dissolved at temperatures below about 1150° C. and a region free of oxygen precipitate nucleation centers in the surface layer.

* * * * *